US008970940B2

(12) United States Patent
Kaitoh et al.

(10) Patent No.: US 8,970,940 B2
(45) Date of Patent: Mar. 3, 2015

(54) DISPLAY DEVICE AND MANUFACTURING METHOD OF THE DISPLAY DEVICE

(75) Inventors: Takuo Kaitoh, Mobara (JP); Takeshi Kuriyagawa, Mobara (JP); Ryou Sakata, Mobara (JP); Osamu Karikome, Katsuura (JP); Timothy J. Brosnihan, Natick, MA (US)

(73) Assignee: Pixtronix, Inc., San Diego, CA (US)

( * ) Notice: Subject to any disclaimer, the term of this patent is extended or adjusted under 35 U.S.C. 154(b) by 114 days.

(21) Appl. No.: 13/526,568

(22) Filed: Jun. 19, 2012

(65) Prior Publication Data
US 2012/0326179 A1 Dec. 27, 2012

(30) Foreign Application Priority Data
Jun. 21, 2011 (JP) ................................. 2011-137656

(51) Int. Cl.
G02B 26/00 (2006.01)
G02B 26/08 (2006.01)
B81B 7/00 (2006.01)

(52) U.S. Cl.
CPC ............ G02B 26/0841 (2013.01); B81B 7/007 (2013.01); B81C 2201/016 (2013.01); B81B 2201/045 (2013.01); B81C 2201/0132 (2013.01)
USPC ............ 359/290; 359/230; 359/291; 345/109

(58) Field of Classification Search
USPC ................... 359/230, 290, 291; 345/108, 109
See application file for complete search history.

(56) References Cited

U.S. PATENT DOCUMENTS

| 7,417,782 | B2 | 8/2008 | Hagood et al. | |
|---|---|---|---|---|
| 8,526,193 | B2 * | 9/2013 | Kim et al. | 361/760 |
| 2006/0250325 | A1 | 11/2006 | Hagood et al. | |
| 2009/0231313 | A1 | 9/2009 | Teranishi et al. | |
| 2010/0047528 | A1 | 2/2010 | Lee et al. | |
| 2010/0110518 | A1 | 5/2010 | Wu et al. | |
| 2013/0010342 | A1 * | 1/2013 | Hagood et al. | 359/230 |

FOREIGN PATENT DOCUMENTS

| CN | 101373777 | A | 2/2009 |
|---|---|---|---|
| CN | 101694542 | A | 4/2010 |
| CN | 101833932 | A | 9/2010 |
| JP | 2008-197668 | | 8/2008 |
| JP | 2012252211 | A * | 12/2012 |
| KR | 20120059181 | A | 6/2012 |
| WO | WO 2006/091738 | A1 | 8/2006 |
| WO | WO 2009/102471 | | 8/2009 |

OTHER PUBLICATIONS

Taiwan Search Report—TW101122279—TIPO—Feb. 24, European Search Report—EP12172598—Search Authority—Munich—Oct. 30, 2012.

* cited by examiner 2013.

Primary Examiner — Matthew E Warren
(74) Attorney, Agent, or Firm — Edward A. Gordon; Foley & Lardner LLP

(57) ABSTRACT

The MEMS shutter includes a shutter having an aperture part, a first spring connected to the shutter, a first anchor connected to the first spring, a second spring and a second anchor connected to the second spring, an insulation film on a surface of the shutter, the first spring, the second spring, the first anchor and the second anchor, the surfaces being in a perpendicular direction to a surface of a substrate, and the insulation film is not present on a surface of the plurality of terminals, and a surface of the shutter, the first spring, the second spring, the first anchor and the second anchor, the surfaces being in a parallel direction to a surface of the substrate and on the opposite side of the side facing the substrate.

16 Claims, 6 Drawing Sheets

(A)

(B)

DISPLAY DEVICE AND MANUFACTURING METHOD OF THE DISPLAY DEVICE

CROSS-REFERENCE TO RELATED APPLICATIONS

This application is based upon and claims the benefit of priority from the prior Japanese Patent Application No. 2011-137656, filed on Jun. 21, 2011; the entire contents of which are incorporated herein by reference.

FIELD

The present invention is related to a display device which uses a mechanical shutter.

BACKGROUND

In recent years display devices which use a mechanical shutter based on MEMS (Micro Electro Mechanical Systems) technology are gathering attention. A display device which uses a MEMS shutter (referred to as [MEMS display device] below) controls the amount of light which passes through a shutter by rapidly opening and closing a MEMS shutter arranged on each pixel using a TFT to adjust the brightness of the pixels (For example, refer to Patent Document 1 [Japanese Laid Open Patent 2008-197668]). A time-ratio gray scale method is adopted in the MEMS display device whereby an image is displayed by switching in sequence red, green and blue light from an LED backlight. The MEMS display device does not require a polarization film or color filter which are used in liquid crystal display devices and is characterized by having around ten times the usage efficiency of backlight light and half or less the power consumption compared to liquid crystal display devices and also has excellent color reproducibility.

In a MEMS display device a TFT which comprises a switching element for driving a MEMS shutter and a gate driver or data driver for driving the switching element is formed on a substrate. A terminal for supplying an external signal to the TFT is simultaneously formed on the substrate. Usually, in the MEMS display device a passivation film which covers the TFT and terminal is formed on the TFT substrate formed with the TFT and terminal, and a MEMS shutter is formed on the passivation film. Following this, an opposing substrate is bonded to the TFT substrate formed with the MEMS shutter. Since it is necessary to supply an external signal to the terminal formed on the TFT substrate, the TFT substrate and opposing substrate and bonded together so that the opposing substrate does not cover the upper part of the terminal.

Since is necessary to supply an external signal to the terminal formed on the TFT substrate it is necessary to remove the passivation film on the terminal. Usually, in a TFT or semiconductor process the passivation film on the terminal is removed by combining a photolithography process and etching process. On the other hand, in the case of a MEMS display device the working parts of a MEMS shutter are in a floating state and thus it is often difficult to apply a photolithography process (resist coating etc) after forming the MEMS shutter.

In addition, there is a method for removing the passivation film on the terminal by a dry etching process after bonding the TFT substrate and opposing substrate and cutting them into individual MEMS display devices. However, in the removal method of the passivation film there is a problem in which the manufacturing throughput of a MEMS display device drops significantly and specialized devices are required.

In addition, while there is a method for removing the passivation film by irradiating a laser onto the terminal upper part the manufacturing throughput of a MEMS display device drops significantly.

Thus, the present invention was realized in an attempt to solve the problems described above by providing a display device and manufacturing method of the display device in which specialized devices are not required and whereby a passivation film is removed from a terminal without decreasing manufacturing throughput.

SUMMARY

According to one embodiment of the present invention, a display device is provided including a plurality of pixels arranged above a substrate in a matrix and including a switching element and a MEMS shutter driven by the switching element and a plurality of terminals arranged above the substrate and connected to an external terminal, wherein the MEMS shutter includes a shutter having an aperture part, a first spring connected to the shutter, a first anchor connected to the first spring, a second spring and a second anchor connected to the second spring, an insulation film on a surface of the shutter, the first spring, the second spring, the first anchor and the second anchor, the surfaces being in a perpendicular direction to a surface of a substrate, and the insulation film is not present on a surface, the surfaces being in a parallel direction to a surface of the substrate and on the opposite side of the side facing the substrate.

According to one embodiment of the present invention, the first spring and the second spring may be electrostatically driven by a potential difference between the first anchor and the second anchor.

According to one embodiment of the present invention, the potential difference between the first anchor and the second anchor may be supplied by the switching element.

According to one embodiment of the present invention, the display device may further include a back light; wherein the substrate includes an aperture part and light supplied from the backlight is allowed to pass through from an overlapping section of the aperture part of the shutter and the aperture part of the substrate.

According to one embodiment of the present invention, the display device may further include a reflection part arranged above the substrate, wherein light reflected by the reflection part is allowed to pass through an overlapping part of the aperture part of the shutter and the reflection part.

According to one embodiment of the present invention, the display device may further include an insulation film above the switching element.

According to one embodiment of the present invention, the display device may further include an insulation film on a surface of the shutter, first spring and second spring, the surfaces being in a parallel direction to the surface of the substrate and on the side facing the substrate, and the insulation film on a surface of the shutter, first spring and second spring, the surfaces being in a parallel direction to the surface of the substrate and on the side facing the substrate, is thinner than the insulation film on the surface of the shutter, the first spring and the second spring, the surfaces being in a perpendicular direction to the substrate.

According to one embodiment of the present invention, the shutter may be formed by stacking layers having materials with different transmittance ratios.

According to one embodiment of the present invention, the shutter may be formed by stacking layers having materials with different transmittance ratios and a material having the lowest transmittance is arranged on a surface of the shutter, the surface in a parallel direction to the surface of the substrate and on the opposite side of the side facing the substrate.

In addition, according to one embodiment of the present invention, a manufacturing method of a display device is provided including forming a switching element and a terminal on a substrate, forming a first insulation film on the switching element, forming a plurality of pixels driven by the switching element on the first insulation film, the plurality of pixels including a shutter having an aperture part, a first spring connected to the shutter, a first anchor connected to the first spring, a second spring and a second anchor connected to the second spring, forming a second insulation film on the shutter, the first spring, the second spring, the first anchor, the second anchor and the terminal, and anisotropically etching the second insulation film.

According to one embodiment of the present invention, the second insulation film is anisotropically etched until the terminal is exposed.

According to one embodiment of the present invention, the second insulation film may be formed on a surface of the shutter, the first spring, the second spring, the first anchor and the second anchor, the surfaces being in a perpendicular direction to a surface of the substrate, and the second insulation film formed on a surface of the shutter, the first spring, the second spring, the first anchor and the second anchor, the surfaces being in a perpendicular direction to a surface of the substrate, may remain after the anisotropic etching.

According to one embodiment of the present invention, the second insulation film may be formed on a surface of the shutter, the first spring, the second spring, the first anchor and the second anchor, the surfaces being in a perpendicular direction to a surface of the substrate, and a surface of the shutter, the first spring and the second spring, the surfaces being in a parallel direction to the surface of the substrate and on the side facing the substrate, and the second insulation film formed on a surface of the shutter, the first spring and the second spring, the surfaces being in a parallel direction to the surface of the substrate and on the side facing the substrate, may be thinner than the second insulation film on the surface of the shutter, the first spring and the second spring, the surfaces being in a perpendicular direction to a surface of the substrate.

According to one embodiment of the present invention, the shutter may be formed by stacking layers having materials with different transmittance ratios.

According to one embodiment of the present invention, the shutter may be formed by stacking layers having materials with different transmittance ratios and a material having the lowest transmittance may be arranged on a surface of the shutter, the surface being in a parallel direction to the surface of the substrate and on the opposite side of the side facing the substrate.

BRIEF DESCRIPTION OF THE DRAWINGS

FIG. 1 (B) is a planar view of the display device 100 related to one embodiment of the present invention;

DESCRIPTION OF THE EMBODIMENTS

Figure 1:
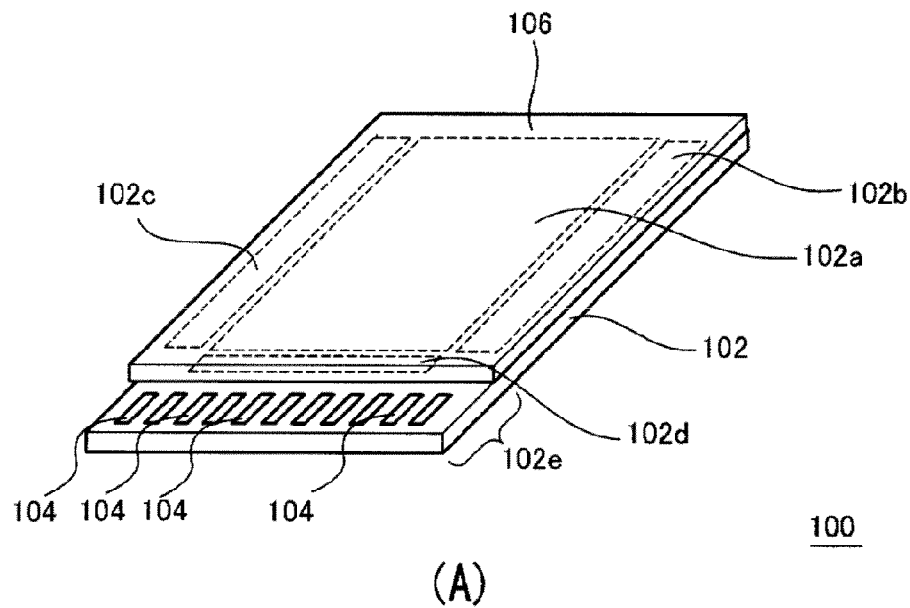
FIG. 1 (A) is a perspective view of a display device 100 related to one embodiment of the present invention.
Figure 1:
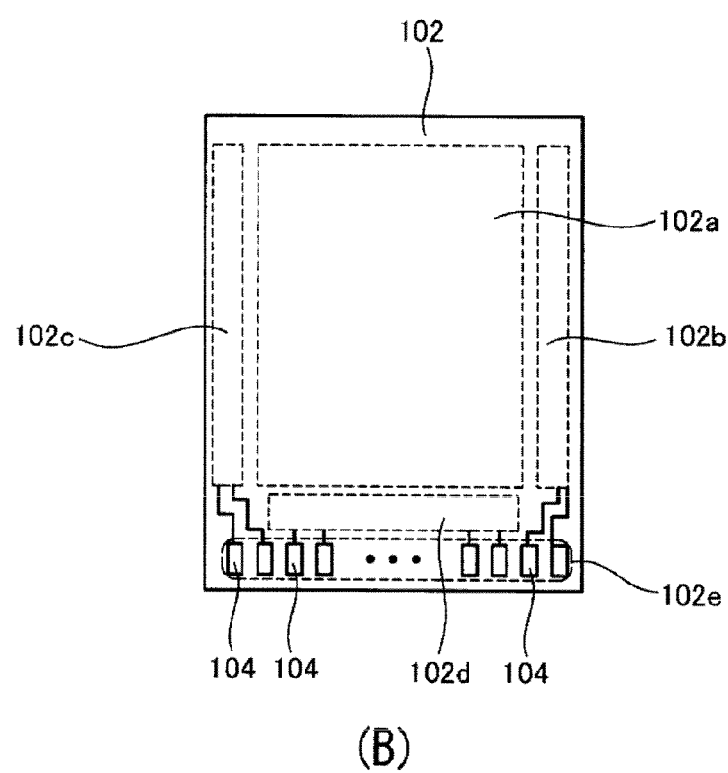

The embodiments of the display device of the present invention are explained below while referring to the drawings. Furthermore, the display device of the present invention can be realized by performing various modifications without limiting the embodiments below.

FIGS. 1 (A) and (B) show a display device 100 related to one embodiment of the present invention. FIG. 1 (A) shows a perspective view of the display device 100 related to one embodiment of the present invention. FIG. 1 (B) shows a planar view of the display device 100 related to one embodiment of the present invention. The display device 100 related to the present embodiment of the present invention includes a substrate 102 and an opposing substrate 106. The substrate 102 includes a display part 102a, drive circuits 102b, 102c and 102d, and a terminal part 102e.

Figure 2:
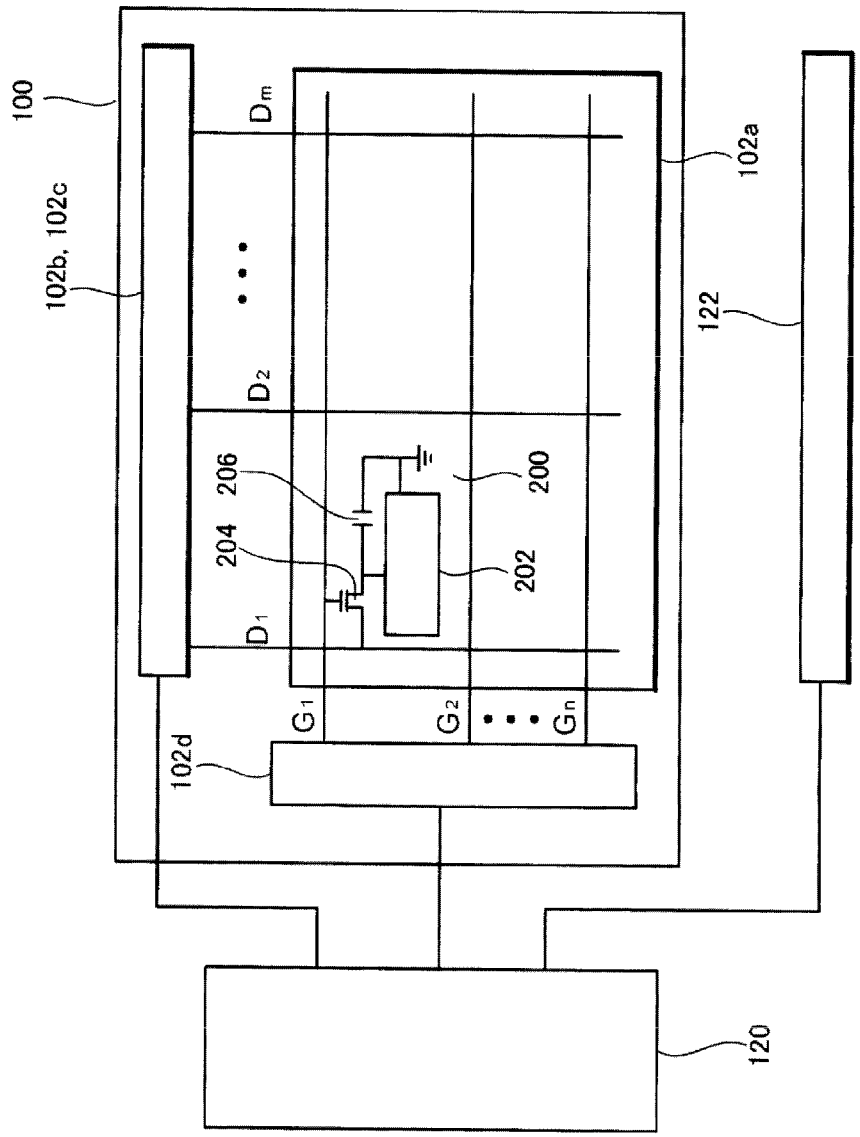
FIG. 2 is a circuit block diagram of the display device 100 related to one embodiment of the present invention.

FIG. 2 shows a circuit block diagram of the display 100 related to the present embodiment of the present invention. An image signal and a control signal are provided from a controller 120 in the display device 100 related to the present embodiment of the present invention shown in FIG. 2. In addition, light is supplied from a back light 122 controlled by the controller 120 in the display device 100 related to the present embodiment of the present invention shown in FIG. 2. Furthermore, the display device 100 of the present invention may be comprised including the controller 120 and the backlight 122.

As is shown in FIG. 2, the display device 102a includes a mechanical shutter (MEMS shutter) 202 arranged in a matrix and a pixel 200 having a switching element 204 and retaining capacitance 206. The drive circuits 102b and 102c are data drivers and supply data signals via data lines (D1, D2, ... Dm) to the switching element. The switching element drive circuit 102d is a gate driver and supplies gate signals via gate lines (G1, G2, ... Gn) to the switching element 204. Furthermore, in the present embodiment, as is shown in FIG. 1, the drive circuits 102b and 102c which are data drivers may be arranged so as to sandwich the display part 102a although their arrangement is not limited to this. The switching element 204 drives the MEMS shutter 202 based on the data signals supplied from the data lines (D1, D2, ... Dm).

Figure 3:
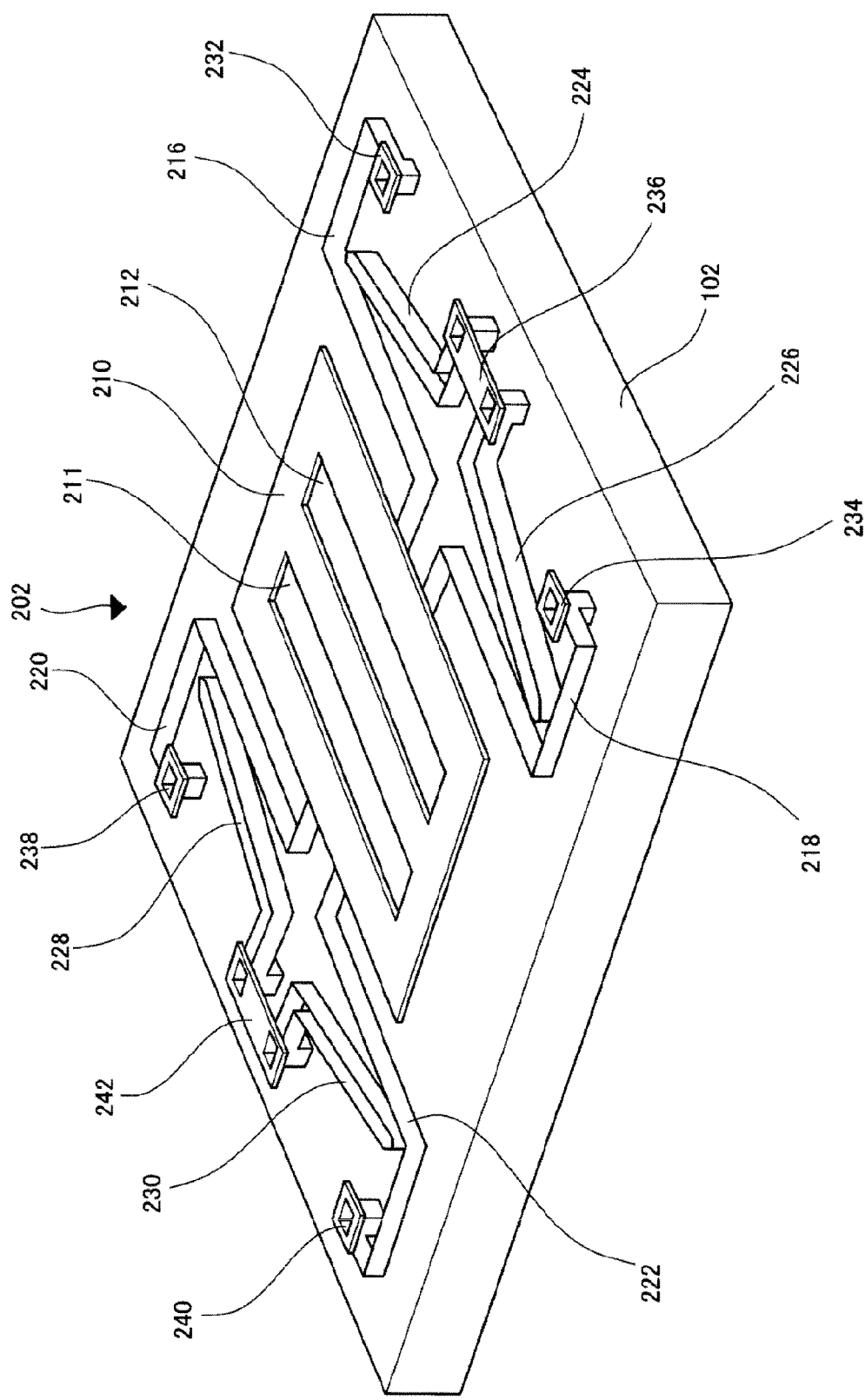
FIG. 3 is a diagram which shows the structure of a MEMS shutter 200 used in the display device 100 related to one embodiment of the present invention.
Figure 4:
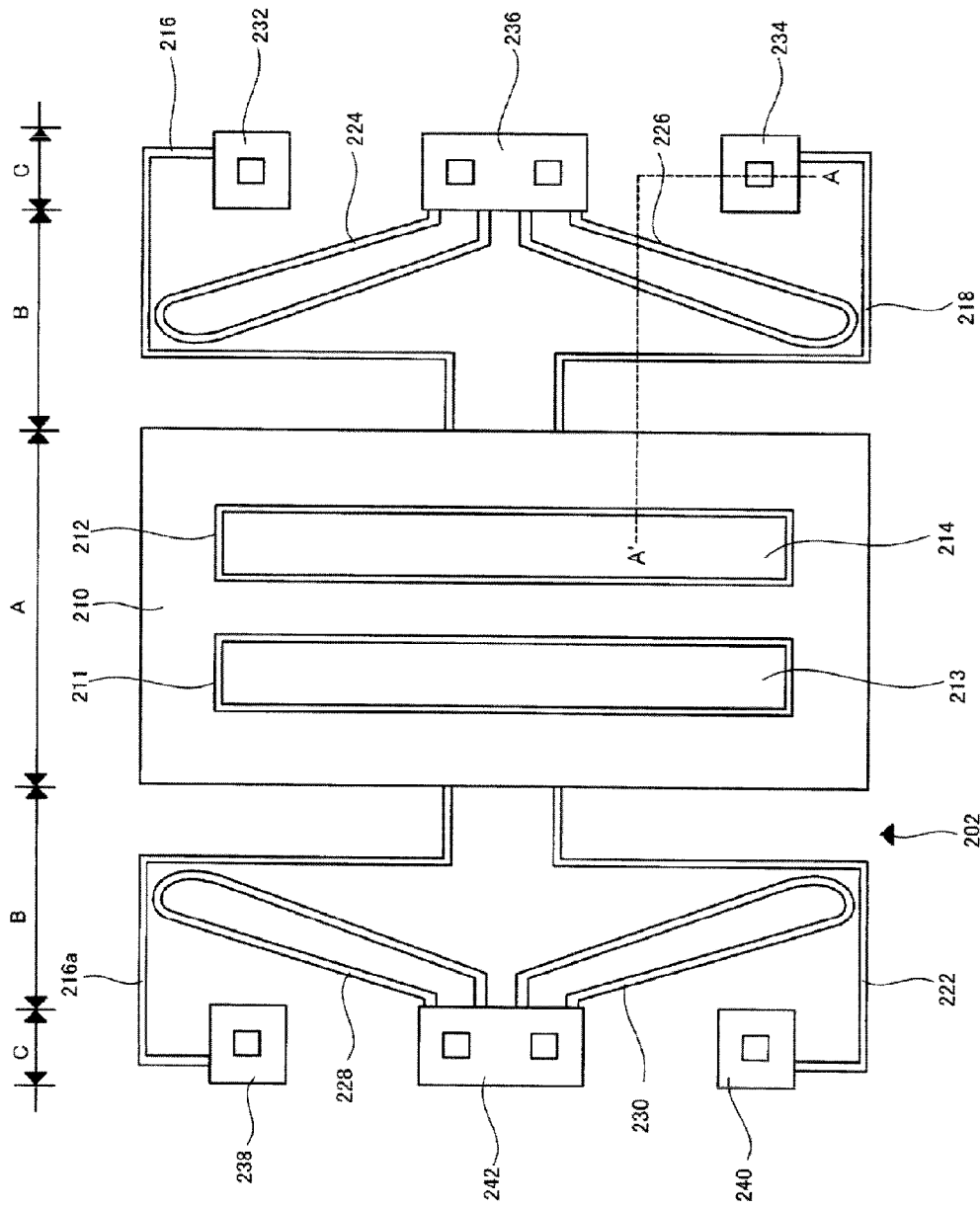
FIG. 4 is a diagram which shows the structure of the MEMS shutter 200 used in the display device 100 related to one embodiment of the present invention.

Here, the structure of the MEMS shutter 202 used in the display device 100 related to the present embodiment of the present invention is shown in FIG. 3 and FIG. 4. Although one MEMS shutter 202 is shown in FIG. 3 for the purposes of explanation, the MEMS shutter 202 shown in FIG. 3 is arranged in a matrix shape in the display device 100 related to the present embodiment of the present invention.

The MEMS shutter 202 includes a shutter 210, first springs 216, 218, 220 and 222, second springs 224, 226, 228 and 230 and anchor parts 232, 234, 236, 238, 240 and 242. The shutter 210 includes aperture parts 211 and 212 and the main body of the shutter 210 acts as a light blocking part. In addition, the substrate 102 includes aperture parts 213 and 214. The aperture parts 211 and 212 of the shutter 210 and the aperture parts 213 and 214 of the substrate 102 are arranged so as to approximately overlap in a planar direction, and the light which is supplied from the rear surface of the substrate 102 and passes through the aperture parts 213 and 214 of the substrate 102 also passes through the aperture parts 211 and 212 of the shutter 210. Furthermore, the MEMS shutter 202 shown in the present embodiment is merely one example of a MEMS shutter which can be used in the display device 100 of the present invention and as long as the MEMS shutter can be driven using a switching element any variation can be used. Furthermore, it is possible to arrange a reflection part on the lower part of the aperture parts 211 and 212 as a reflection type display device without using the back light 122 or arranging the aperture parts 213 and 214 of the substrate 102.

One side of the shutter 210 is connected to the anchor parts 232 and 234 via the first springs 216 and 218. The anchor parts 232 and 234 include a function for supporting the first springs 216 and 218 as well as the shutter 210 in a floating state from the surface of the substrate 102. The anchor part 232 is electrically connected to the first spring 216 and the anchor part 234 is electrically connected to the first spring 218. A bias potential is supplied from the switching element 204 to the anchor parts 232 and 234 and a bias potential is supplied to the first springs 216 and 217. In addition, the second springs 224 and 226 are connected to the anchor part 236. The anchor part 236 includes a function for supporting the second springs 224 and 226. The anchor part 236 is electrically connected to the second springs 224 and 226. A ground potential is supplied to the anchor part 236 and a ground potential is supplied to the second springs 224 and 226.

In addition, the other side of shutter 210 is connected to the anchor parts 238 and 240 via the first springs 220 and 222. The anchor parts 238 and 240 include a function for supporting the first springs 220 and 222 as well as the shutter 210 in a floating state from the surface of the substrate 102. The anchor part 238 is electrically connected to the first spring 220 and the anchor part 240 is electrically connected to the first spring 222. A bias potential is supplied from the switching element 204 to the anchor parts 238 and 240 and a bias potential is supplied to the first springs 220 and 222. In addition, the second springs 228 and 230 are connected to the anchor part 232. The anchor part 242 includes a function for supporting the second springs 228 and 230. The anchor part 242 is electrically connected to the second springs 228 and 230. A ground potential is supplied to the anchor part 242 and a ground potential is supplied to the second springs 228 and 230.

Furthermore, in the upper part of FIG. 4, for the purposes of explanation, a region which includes the shutter 210 is shown by "A", a region which includes the first springs 216, 218, 220 and 222 and the second springs 224, 226, 228 and 230 is shown by "B", and a region which includes the anchor parts 232, 234, 236, 238, 240 and 242 is shown by "C".

As described above, in the present embodiment, a bias potential is supplied from the switching element 204 to the anchor parts 232 and 234, a bias potential is supplied to the first springs 216 and 217, and a ground potential is supplied to the anchor part 236 and the second springs 224 and 226. The first spring 216 and second spring 224 are electrostatically driven and move towards each other by a potential difference between the first springs 216, 218, and the first spring 218 and second spring 234 are electrostatically driven and move towards each other by a potential difference between the second springs 224, 226 and the shutter 210 moves.

In addition, similarly a bias potential is supplied from the switching element 204 to the anchor parts 238 and 240, a bias potential is supplied to the first springs 220 and 222, and a ground potential is supplied to the anchor part 242 and the second springs 228 and 230. The first spring 220 and second spring 284 are electrostatically driven and move towards each other by a potential difference between the first springs 220, 222, and the first spring 222 and second spring 230 are electrostatically driven and move towards each other by a potential difference between the second springs 228, 230 and the shutter 210 moves.

Furthermore, in the present embodiment, an example is explained in which the first springs, the second springs and anchor parts are connected and arranged on both sides of the shutter 210. However, the display device of the present invention is not limited to this configuration. The first springs, second springs and anchor parts may be connected and arranged on one side of the shutter 210, just the first springs and anchor parts may be connected and arranged on the other side of the shutter 210, the first springs and anchor part on the other side of the shutter 210 may be provided with a function for supporting the shutter in a floating state from the substrate, and the first and second springs on the one side of the shutter 210 may be electrostatically driven which operates the shutter 210.

Figure 5:
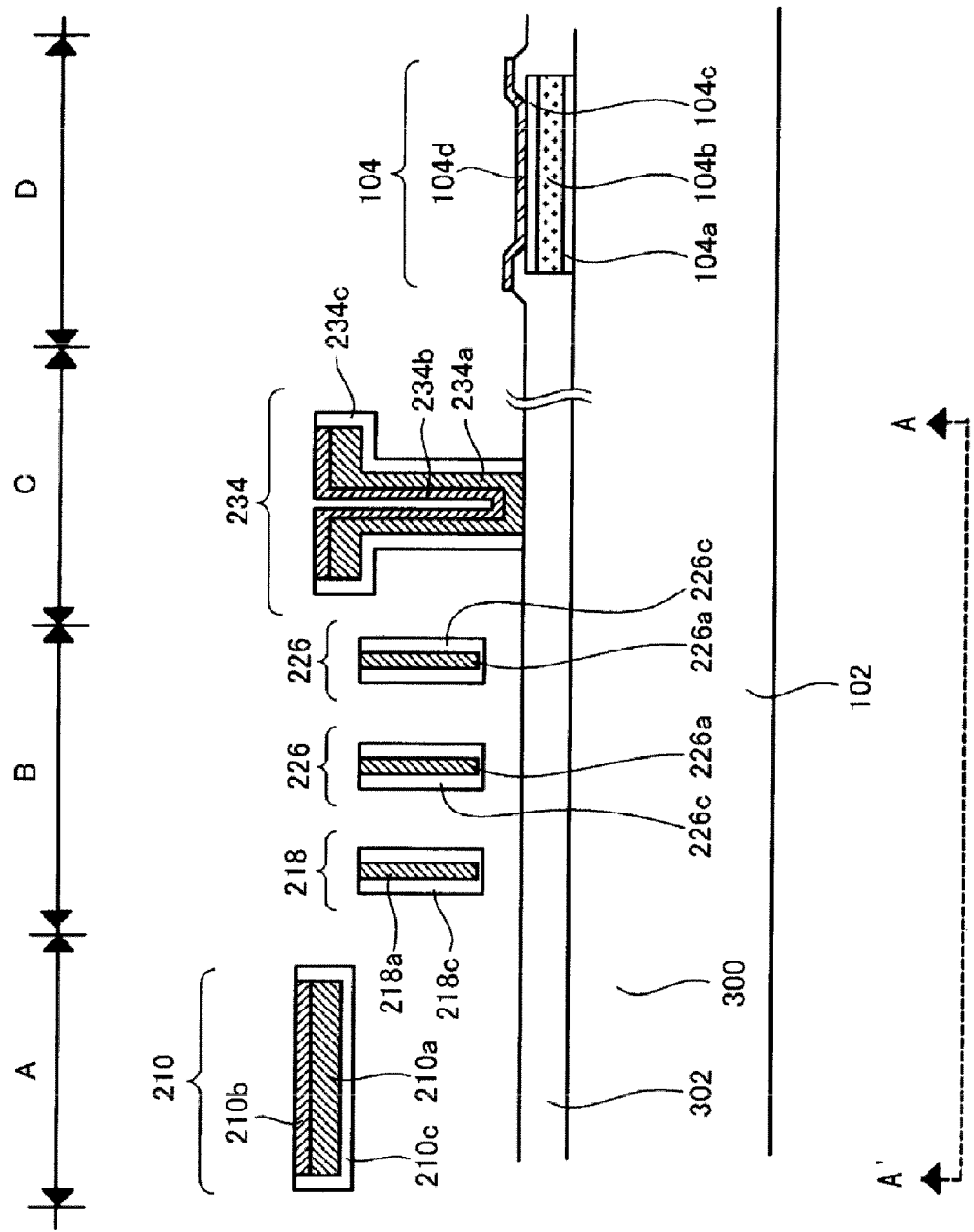
FIG. 5 is a cross sectional diagram of a display part (parts shown by the line A-A' in the MEMS shutter 200 shown in FIG. 4) and a terminal part 102e (terminal 104) of the display device 100 related to one embodiment of the present invention.

Next, FIG. 5 is referred to. FIG. 5 is a cross sectional diagram of a display part (parts shown by the line A-A' in the MEMS shutter 200 shown in FIG. 4) and a terminal part 102e (terminal 104) of the display device 100 related to one embodiment of the present invention. Furthermore, in the upper part of FIG. 5, the region which includes the terminal part 102 is shown by "D" for purposes of explanation.

As is shown in FIG. 5, in the display device 100 related of the present invention related to the present embodiment, the shutter 210 includes a stacked layered body comprised of a-Si (210a) and AlSi (210b) for blocking light having a lower transmittance rate than a-Si, and an insulation film (passivation film) 210c. In the present embodiment, the insulation film (passivation film) 210c is included only on the side part (surface in a perpendicular direction to the surface of the substrate 102) and the lower part (surface on the side facing the substrate 102 which is in a parallel direction to the surface of the substrate 102) of the stacked layered body comprised of a-Si (210a) and AlSi (210b) for blocking light. In other words, the insulation film (passivation film) does not exist on the upper part (surface on the opposite side of the side facing the substrate 102 which is in a parallel direction to the surface of the substrate 102) of the stacked layered body comprised of a-Si (210a) and AlSi (210b) for blocking light. Furthermore, in the present embodiment, a stacked layered body comprised of a-Si (210a) and AlSi (210b) for blocking light is used in the shutter 210. However, the present invention is not limited to this configuration. Any structure and material may be used as long as the insulation film (passivation film) is formed on the side and lower parts. In addition, in the present embodiment, an example is explained whereby the insulation film (passivation film) 201c is included only on the side and lower parts of the stacked layered body comprised of a-Si (210a) and AlSi (210b) for blocking light. However, it is important that the insulation film (passivation film) does not exist on the upper part of the shutter 210 and the insulation film (passivation film) may or may not be included on the lower part. In addition, the thickness of the insulation film (passivation film) may be different on the side part and lower part. For example, the insulation film (passivation film) may be thinner on the lower part than the side part.

In addition, as is shown in FIG. 5, in the display device 100 of the present invention related to the present embodiment, the first springs 216, 218, 220 and 222 (omitted from the diagram except 218) and the second springs 224, 226, 228 and 230 (omitted from the diagram except 226) each include an insulation film (passivation film) on the side part (surface in a perpendicular direction to the surface of the substrate 102) and lower part (surface on the side facing the substrate 102 which is in a parallel direction to the surface of the substrate 102) of a-Si. As is shown in FIG. 5, using the first spring 226 and second spring 218 as an example, the first spring 226 includes the insulation film (passivation film) 226c on the side part and lower part of a-Si (226a) and the second spring 218 includes the insulation film (passivation film) 218c on the side part and lower part of a-Si (218a). In other words, in the first spring 226, the insulation film (passivation film) does not exist on the upper part (surface on the opposite side of the side facing the substrate and which is in a parallel direction to the surface of the substrate 102) of a-Si (226a) and the insulation film (passivation film) does not exist on the upper part (surface on the opposite side of the side facing the substrate 102 and which is in a parallel direction to the surface of the substrate 102) of a-Si (218a). With this configuration, the first springs 216, 218, 220 and 222 and the second springs 224, 226, 228 and 230 are insulated and separated by the insulation film (passivation film). Furthermore, in the present embodiment, a-Si is used in the first springs 216, 218, 220 and 222 and the second springs 224, 226, 228 and 230. However, the present embodiment is not limited to a-Si. Any structure or material can be used as along as the insulation film (passivation film) is formed only on the side and lower parts. In addition, in the present embodiment an example is explained in which the insulation film (passivation film) is included only on the side and lower parts of the first springs 216, 218, 220 and 222 and the second springs 224, 226, 228 and 230. However, it is important that the insulation film (passivation film) does not exist on the upper part of the first springs 216, 218, 220 and 222 and the second springs 224, 226, 228 and 230, the insulation film (passivation film) may or may not exist on the lower part and the thickness of the insulation film (passivation film) may be different on the side part and lower part.

As is shown in FIG. 5, in the display device 100 of the present invention related to the present embodiment, the anchor parts 232, 234, 236, 238, 240 and 242 (omitted from the diagram except 234) each include a stacked layered body of a-Si and AlSi and an insulation film (passivation film). As is shown in FIG. 5, using the anchor part 234 as an example, the anchor part 234 includes a stacked layered body of a-Si (234a) and AlSi (234b) and insulation film (passivation film) 234c. The anchor part 234 is formed on an insulation film 302 (passivation film) which is formed on a TFT substrate 300 which forms the substrate 102. In the present embodiment, the insulation film (passivation film) 234c is included only on the side part (surface in a perpendicular direction to the surface of the substrate 102) and lower part (surface of the side facing the surface of the substrate 102 which is in a parallel direction to the surface of the substrate 102) of the stacked layered body of a-Si (234a) and AlSi (234b). In other words, an insulation film (passivation film) does not exist on the upper part (surface on the opposite side of the side facing the substrate 102 which is in a parallel direction to the substrate 102) of the stacked layered body of a-Si (234a) and AlSi (234b). Furthermore, in the present embodiment, a stacked layered body of a-Si and AlSi is used in the anchor parts 232, 234, 236, 238, 240 and 242. However, the present invention is not limited to this configuration. Any structure and material can be used as long as the insulation film (passivation film) is formed only on the side and lower parts. In addition, in the present embodiment, an example is explained in which the insulation film (passivation film) is included only on the side and lower parts of the stacked layered body of a-Si and AlSi. However, it is important that the insulation film (passivation film) does not exist on the upper part of the anchor parts 232, 234, 236, 238, 240 and 242, the insulation film (passivation film) may or may not be included on the lower part and the thickness of the insulation film (passivation film) may be different on the side part and lower part.

In addition, as is shown in FIG. 5, in the display device 100 of the present invention related to the present embodiment, the terminal 104 of the terminal part 104e is formed by MoW (104a), Al (104b), MoW (104c) and ITO (104d). Furthermore, the structure and material of the terminal 104 is not limited to this configuration. It is possible to change this configuration according to the structure of the switching element (TFT in the present embodiment) and Al (104b) may use a wiring on the same layer as the drain wiring of the switching element 204. The terminal part 102e is formed on one part of the TFT substrate 200 which forms the substrate 102. In the present embodiment, the display part 102a, data drivers 102b and 102c and the gate drivers 102d of the TFT substrate are covered by the insulation film (passivation film) 302, an insulation film (passivation film) does not exists on the surface of the terminal 104 and the terminal 104 is exposed.

As explained above, in the display device 100 of the present invention related to the present embodiment, the upper part of the terminal 104 of the terminal part 104e which is supplied with an external signal is exposed and the first springs 216, 218, 220 and 222 and the second springs 224, 226, 228 and 230 of the MEMS shutter 202 are insulated and separated by an insulation film (passivation film). Consequently, it is possible to efficiently perform an electrostatic drive operation of the MEMS shutter. Furthermore, no problem is produced even in the case where no insulation film (passivation film) exists on parts (for example, the upper surface of the shutter 210 etc) other than the first springs 216, 218, 220 and 222 and the second springs 224, 226, 228 and 230.

Figure 6:
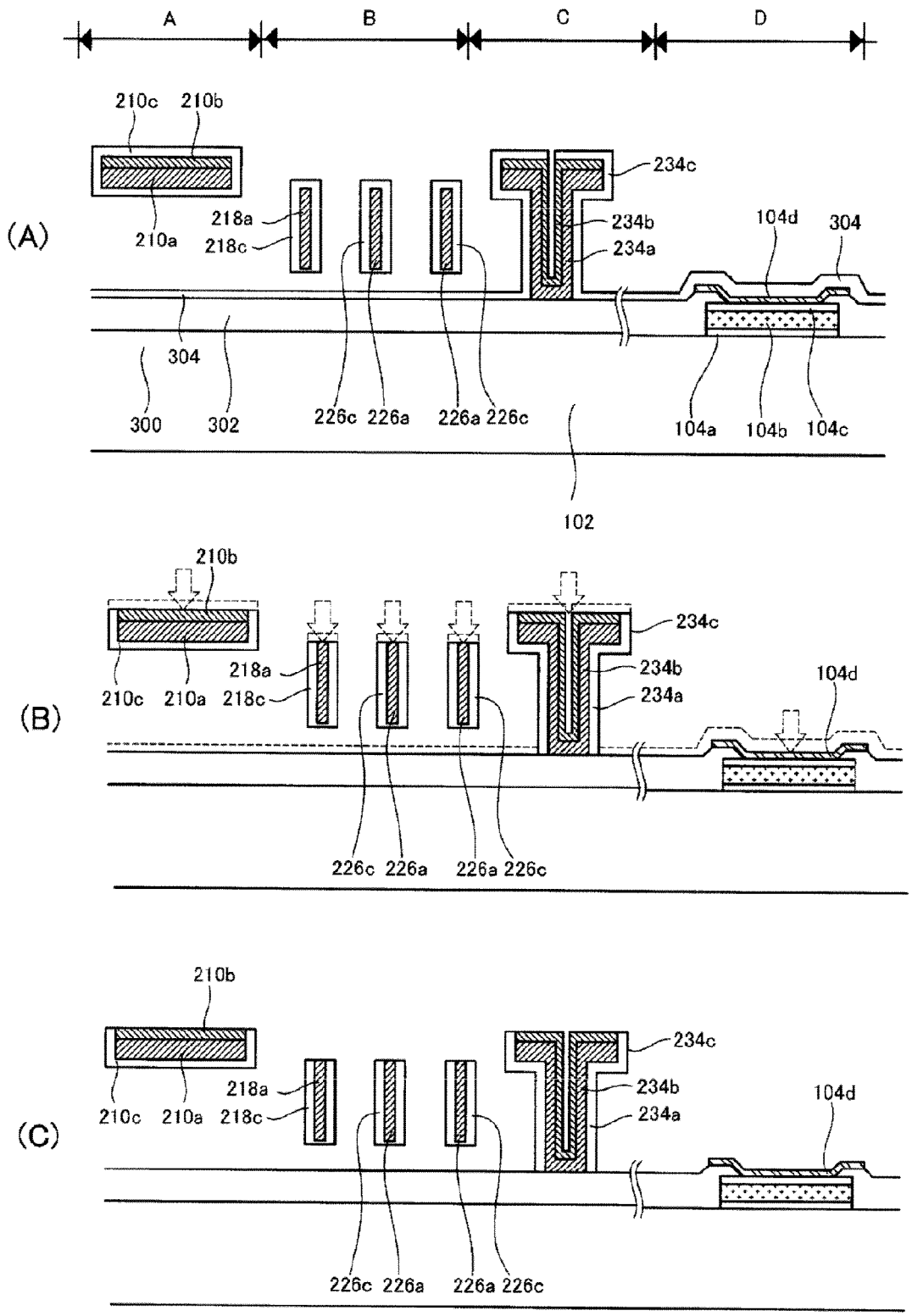
FIG. 6 is a diagram which shows a manufacturing device of the display device 100 related to one embodiment of the present invention.

Next, a manufacturing process of the display device 100 of the present invention related to the present embodiment is explained while referring to FIG. 6.

First, a switching element (TFT in the present embodiment) comprising a display part 102a, data drivers 102b, 102c, and gate driver 102d of the substrate 102, and terminal 104 (MoW (104a), Al (104b) and MoW (104c) in FIG. 6) which forms the terminal part 102e, are formed, the TFT substrate 300 is formed, the terminal part 102e is removed and an insulation film (passivation film) 302 of SiN etc is formed. Furthermore, ITO (104d) may be formed before forming the insulation film 302 and may be formed on parts (parts on which the insulation film 302 is not formed) of the terminal part 102e after forming the insulation film 302. Next, the MEMS shutter 202 (shutter 210, first spring 218, second spring 226 and anchor part 234 in FIG. 6) is formed on the insulation film (passivation film) 302. Next, an insulation film such as SiN which becomes a passivation film is formed above the entire substrate 102 using a general PECVD method and insulation films 210c, 218c, 226c, 234c and 304 are formed (FIG. 6 (A)). At this time, an insulation film may not be formed on the lower part (surface on the side facing the substrate 102 which is in a parallel direction to the surface of the substrate 102) of the shutter 210, first spring 218, second spring 226 and anchor part 234 of the MEMS shutter 202, and an insulation film on the lower part having a different film thickness (thinner for example) from the surface in a perpendicular direction to the substrate 102 or from the surface on the opposite side of the side facing the substrate 102 which is in a parallel direction to the surface of the substrate 102 may be formed.

Next, the insulation films 210*c*, 218*c*, 226*c*, 234*c* and 304 are processed by anisotropic etching (Fig. (B)). Because an anisotropic etching process is used, the insulation film located on the surface on the opposite side of the side facing the substrate 102 which is in a parallel direction to the surface of the substrate 102 is etched at a high etching rate (dotted line arrow in FIG. 6 (B)), and the insulation film located on the surface in a perpendicular direction to the surface of the substrate 102 and the surface of the side facing the substrate 102 which is in a parallel direction to the surface of the substrate 102 is left without etching (FIG. 6 (C)). At this time, the insulation film 304 above the terminal 104 of the terminal part 102*e* is also removed and the terminal 104 is exposed. The insulation film located on the surface on the opposite side of the side facing the substrate 102 which is in a parallel direction to the surface of the substrate 102 is removed and the terminal 104 is exposed, and the etching process is performed so that the insulation film between the first springs 216, 218, 220 and 222 and the second springs 224, 226, 228 and 230 remains. A fluorine group gas is used in the case where the insulation film is SiN, and it is possible to use a capacitive coupled plasma method, inductive coupled plasma, or electron cyclotron resonance plasma method as the dry etching equipment. Furthermore, it is possible to further increase the anisotropy of the etching process the by forming a protection film on a side wall by adding $O_2$ gas.

Next, an opposing substrate (not shown in the diagram) is boded using a known method and the display device 100 of the present invention related to the present embodiment is complete. Because the terminal 104 of the terminal part 102*e* is exposed, an electrical connection with an external terminal such as a flexible cable becomes possible.

In the display device 100 of the present invention related to the present embodiment, special processes are not required because the insulation film (passivation film) on a terminal is removed by a generally used dry etching process before the TFT substrate and opposing substrate are bonded together (pre-processing), and because it is possible to process at a high throughput it is possible to achieve a reduction in costs of a display device. In addition, specialized devices which were conventionally required in order to remove a passivation film on a terminal by a dry etching process after bonding a TFT substrate and opposing process together and cutting are not required and thus it is possible to provide a display device and manufacturing method of a display device in which an insulation film (passivation film) on a terminal is removed without reducing manufacturing throughput.

What is claimed is:

1. A display device comprising:
   a plurality of pixels arranged above a substrate in a matrix and including a switching element and a MEMS shutter driven by the switching element; and
   a plurality of terminals arranged above the substrate and connected to an external terminal;
   wherein the MEMS shutter includes:
      a shutter having an aperture part, a first spring connected to the shutter, a first anchor connected to the first spring, a second spring and a second anchor connected to the second spring, and
      an insulation film on at least one surface of each of the shutter, the first spring, the second spring, the first anchor and the second anchor, the at least one surfaces being oriented in a perpendicular direction to a surface of a substrate; and
   wherein the insulation film is not present on the plurality of terminals and those surfaces of the shutter, the first spring, the second spring, the first anchor and the second anchor that are oriented in a parallel direction to, and facing away from the surface of the substrate on which the plurality of terminals are formed.

2. The display device according to claim 1 wherein the first spring and the second spring are electrostatically driven by a potential difference between the first anchor and the second anchor.

3. The display device according to claim 2 wherein the potential difference between the first anchor and the second anchor is supplied by the switching element.

4. The display device according to claim 1 further comprising:
   a back light;
   wherein
   the substrate includes an aperture part and light supplied from the backlight is allowed to pass through from an overlapping section of the aperture part of the shutter and the aperture part of the substrate.

5. The display device according to claim 1 further comprising:
   a reflection part arranged above the substrate;
   wherein
   light reflected by the reflection part is allowed to pass through an overlapping section of the aperture part of the shutter and the reflection part.

6. The display device according to claim 1 further comprising:
   an insulation film above the switching element.

7. The display device according to claim 1 further comprising:
   an insulation film on surfaces of the shutter, first spring and second spring, that are oriented in a parallel direction to the surface of the substrate and are facing the substrate;
   wherein the insulation film on the surfaces of the shutter, first spring, and second spring that are oriented in a parallel direction to the surface of the substrate and are facing the substrate is thinner than the insulation film on the surfaces of the shutter, the first spring and the second spring that are oriented in a perpendicular direction to the substrate.

8. The display device according to claim 1 wherein the shutter is formed by stacking layers having materials with different transmittance ratios.

9. The display device according to claim 1 wherein the shutter is formed by stacking layers having materials with different transmittance ratios such that a material having the lowest transmittance is arranged on a surface of the shutter that is in a parallel direction to, and facing away from, the surface of the substrate.

10. A display device comprising:
    a plurality of pixels arranged above a substrate in a matrix and including a switching element and a MEMS shutter driven by the switching element; and
    a plurality of terminals arranged above the substrate and connected to an external terminal;
    wherein the MEMS shutter includes:
       a shutter having an aperture part, a first spring connected to the shutter, a first anchor connected to the first spring, a second spring and a second anchor connected to the second spring, and an insulation film that coats at least one surface of each of the shutter, the first spring, the second spring, the first anchor and the second anchor, the at least one surfaces being oriented in a perpendicular direction to a surface of a substrate, and wherein the plurality of terminals and those surfaces of the shutter, the first spring, the second spring, the first anchor and the second anchor that are oriented in a parallel direction to, and facing away from the surface of the substrate on which the plurality of terminals are formed are exposed.

11. The display device according to claim 10 further comprising an insulation film above the switching element.

12. The display device according to claim 10 further comprising:

an insulation film on surfaces of the shutter, first spring and second spring, that are oriented in a parallel direction to the surface of the substrate and are facing the substrate;

wherein the insulation film on the surfaces of the shutter, first spring, and second spring that are oriented in a parallel direction to the surface of the substrate and are facing the substrate is thinner than the insulation film on the surfaces of the shutter, the first spring and the second spring that are oriented in a perpendicular direction to the substrate.

13. The display device according to claim 10 wherein the shutter is formed by stacking layers having materials with different transmittance ratios such that a material having the lowest transmittance is arranged on a surface of the shutter that is in a parallel direction to, and facing away from, the surface of the substrate.

14. A display device comprising:

a plurality of pixels arranged above a substrate in a matrix and including a switching element and a light modulating means driven by the switching element; and a plurality of means for forming electrical connections arranged above the substrate;

wherein the light modulating means includes an insulating means that coats at least one surface of each of the light modulating means oriented in a perpendicular direction to a surface of a substrate, and wherein the plurality of electrical connection forming means and those surfaces of the light modulating means that are oriented in a parallel direction to, and facing away from the surface of the substrate on which the plurality of electrical connection forming means are formed are exposed.

15. The display device according to claim 14 further comprising:

insulation means on surfaces of the light modulating means that are oriented in a parallel direction to the surface of the substrate and are facing the substrate;

wherein the insulation means on the surfaces of the light modulating means that are oriented in a parallel direction to the surface of the substrate and are facing the substrate is thinner than the insulation film on the surfaces of light modulating means that are oriented in a perpendicular direction to the substrate.

16. The display device according to claim 14 wherein the light modulating means is formed by stacking layers having materials with different transmittance ratios such that a material having the lowest transmittance is arranged on a surface of the light modulating means that is in a parallel direction to, and facing away from, the surface of the substrate.

* * * * *